(12) United States Patent
Kang et al.

(10) Patent No.: US 7,573,290 B2
(45) Date of Patent: Aug. 11, 2009

(54) DATA OUTPUT DRIVER FOR REDUCING NOISE

(75) Inventors: Hee-Bok Kang, Kyoungki-do (KR); Jin-Hong Ahn, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 362 days.

(21) Appl. No.: 11/056,475

(22) Filed: Feb. 11, 2005

(65) Prior Publication Data

US 2006/0092333 A1    May 4, 2006

(30) Foreign Application Priority Data

Oct. 30, 2004    (KR)    ............... 10-2004-0087703

(51) Int. Cl.
*H03K 17/16*    (2006.01)
*H03K 19/003*    (2006.01)

(52) U.S. Cl. .................. 326/31; 326/21; 326/26; 326/27; 326/28

(58) Field of Classification Search ............ 326/83, 326/30, 86; 327/108
See application file for complete search history.

(56) References Cited

U.S. PATENT DOCUMENTS

| | | | |
|---|---|---|---|
| 6,211,698 B1 * | 4/2001 | Suh | .............. 326/60 |
| 6,323,703 B1 | 11/2001 | Fotouhi | |
| 6,339,817 B1 | 1/2002 | Maesako et al. | |
| 6,545,935 B1 | 4/2003 | Hsu et al. | |
| 6,546,461 B1 | 4/2003 | Au et al. | |
| 6,624,671 B2 | 9/2003 | Fotouhi | |
| 7,173,871 B2 | 2/2007 | Kong et al. | |
| 2001/0006349 A1 * | 7/2001 | Jou et al. | .............. 326/87 |
| 2002/0118041 A1 * | 8/2002 | Lapidus | .............. 326/83 |
| 2004/0124896 A1 | 7/2004 | Byun et al. | |

FOREIGN PATENT DOCUMENTS

| | | |
|---|---|---|
| JP | 07-085680 | 3/1995 |
| KR | 10-1990-0015451 | 10/1990 |
| KR | 10-1998-083435 | 12/1998 |
| KR | 10-2003-0075756 A | 9/2003 |

* cited by examiner

*Primary Examiner*—Vibol Tan
*Assistant Examiner*—Matthew C Tabler
(74) *Attorney, Agent, or Firm*—Blakely, Sokoloff, Taylor & Zafman

(57) ABSTRACT

A data input/output driver for use in a semiconductor memory device includes a data transmitting block for transmitting a data between an inside and an outside of the semiconductor memory device and generating a data driving signal in order to indicate a timing of outputting the data. A reference data generating block generates a reference data. A switching block outputs the reference data in response to the data driving signal. The data and the reference data are combined as an output signal.

28 Claims, 10 Drawing Sheets

A. NORMAL

B. NOISE/STRAIN

C. JITTER/SKEW

FIG. 4

| I/O Pad  Controls | DQ_1 | DQ_2 | DQ_3 | ................ | DQ_n |
|---|---|---|---|---|---|
| Output Data | High | Low | High | | Low |
| ACTL_<0,1,2,..,n> | Low | High | Low | | High |
| ACTH_<0,1,2,..,n> | Low | High | Low | | High |
| SWL_<0,1,2,..,n> | OFF | ON | OFF | | ON |
| SWH_<0,1,2,..,n> | ON | OFF | ON | | OFF |
| high_ref | High | | | | |
| low_ref | Low | | | | |

A. NORMAL

B. NOISE/STRAIN

C. JITTER/SKEW

D. THE PRESENT INVENTION

FIG. 7

| I/O Pad<br>Controls | DQ_1 | DQ_2 | DQ_3 | .................... | DQ_n |
|---|---|---|---|---|---|
| Output Data | High | Low | High | | Low |
| ACTL'_<0,1,2,n> | Low | High | Low | | High |
| ACTH'_<0,1,2,n> | High | Low | High | | Low |
| SWL'_<0,1,2,n><br>State | OFF | ON | OFF | | ON |
| SWH'_<0,1,2,n><br>State | ON | OFF | ON | | OFF |
| high_ref | High | | | | |
| low_ref | Low | | | | |

DATA OUTPUT DRIVER FOR REDUCING NOISE

FIELD OF THE INVENTION

The present invention relates to a semiconductor integrated circuit; and more particularly, to a data output driver of a semiconductor memory device operating at high-speed.

DESCRIPTION OF PRIOR ART

Generally, a semiconductor memory device includes a plurality of input pins for communicating data and instructions with external devices and a plurality of memory cells for storing data. A recently fabricated semiconductor memory device includes more than several million memory cells. A basic function of the semiconductor memory device is to input and output data for the purpose of writing the data on such memory cells and read the written data. Within the semiconductor memory device, a region that is within the periphery of the plurality of input pins is called a peripheral region, while a region in which the plurality of memory cells are located is called a core region.

In respect of a structure of the semiconductor memory device, the core region is designed for maximally integrating a large number of devices in a minimum area of the semiconductor memory device. Thus, a MOS transistor included in a logic block or a logic circuit within the core region becomes smaller and a driving ability of the MOS transistor is also minimized. That is, each MOS transistor has a minimal driving ability for stable operation.

On the other hand, the peripheral region, e.g., data input/output region, includes a data input buffer and a data output driver. The data input buffer is for buffering a data signal inputted from an outside of the semiconductor memory device and delivering the data signal into the core region. The data output driver receives and amplifies a data signal transmitted from the core region and drives an output data line for accurately delivering the data signal outside the semiconductor memory device.

FIG. 1 is a block diagram showing a data input/output driver in a conventional semiconductor memory device.

As shown, the conventional semiconductor memory device includes a core area, a data I/O pad DQ, an input buffer 10 and an output driver 20. Herein, the core area is considered as the above described core region and the data input/output driver includes the input buffer 10 and the output driver 20.

The input buffer 10 receives a data signal inputted through the data I/O pad DQ and delivers the data signal into the core region. On the contrary, the output driver 20 receives a data signal delivered from the core region to thereby deliver the data signal outside of the semiconductor memory device through the data I/O pad DQ.

FIG. 2A is a waveform describing an operation of the input/output driver shown in FIG. 1.

As shown, a voltage difference between a logic low data and a logic high data outputted from the input/output driver is determined by a supply voltage of the input/output driver.

As a design for a semiconductor integrated circuit is developed, it is required that power consumption be reduced and a data signal be transmitted faster between a unit cell and outside the semiconductor integrated circuit. As a result, a level of the supply voltage, i.e., operating voltage, of the semiconductor integrated circuit becomes lower.

If a data swing, i.e., the difference between the logic low data and the logic high data, is narrower, a data is delivered faster. Referring to FIG. 2A, as a design for the semiconductor memory device is developed, the data swing becomes narrower, i.e., about 3.3 V to about 1.0 V to about 200 mV. As a result, i.e., if the data swing outputted from the output driver is narrower, a power dissipation for outputting a data can be reduced.

Further, in FIG. 2A, there is a graph depicting a relation between the power dissipation and the data swing. Approximately, the power dissipation is in an inverse proportion to a square of the data swing.

On the other hand, as a design technology is developed, the semiconductor memory device outputs more data during a predetermined period. That is, for outputting more data during the predetermined period as compared with the prior art semiconductor memory device, more power is consumed. At this time, an increased amount of the power dissipation is in a proportion to an increase of a frequency of an outputted data signal.

Thus, if the data swing is reduced, the power dissipation can be reduced because the semiconductor memory device transmits more data during the predetermined period. Finally, for stably using the semiconductor memory device in a low power system or a lower power voltage condition, the data swing should be decreased.

FIG. 2B is a waveform describing a fault under the operation of the input/output driver shown in FIG. 1.

As above described, as a technology is developed over time, the semiconductor memory device dramatically decreases a data swing of the data input/output driver for maximally reducing a power consumption and delivering more data during a predetermined unit period.

However, since the data swing is narrow, a voltage level of a signal is low and, as a result, a noise cannot be ignored even though the noise has a low level. Further, because of the noise, it is possible that a fault data is outputted from the semiconductor memory device.

In addition, since the data is transmitted at high speed, frequently the data is destroyed by a skew or a jitter on a data path for transmitting the data in the semiconductor memory device.

Referring to FIG. 2B, the symbol 'A' shows a normal signal. As compared with the symbol 'A', a voltage level of the signal described in the symbol 'B' is distorted. Namely, it is shown that a strained signal is outputted from the semiconductor memory device when a noise is generated.

Lastly, the symbol 'C' describes a strained signal distorted by a skew or a jitter on the data path of the semiconductor memory device.

As above described, it is a hot issue how to overcome noise, jitter and skew while stably outputting a data or control signal which is not destroyed or distorted.

SUMMARY OF INVENTION

It is, therefore, an object of the present invention to provide an input/output driver included in a semiconductor device for compensating a strained data signal distorted by noise, jitter and skew to thereby transmit a compensated data signal which is a normal.

In accordance with an aspect of the present invention, there is provided a data input/output driver for use in a semiconductor memory device including a data transmitting block for transmitting a data between inside and outside of the semiconductor memory device and generating a data driving signal in order to indicate a timing of outputting the data; a reference data generating block for generating a reference data; and a switching block for outputting the reference data in response to the data driving signal, wherein the data and the reference data are combined as an output signal.

In accordance with another aspect of the present invention, there is provided a semiconductor memory device, including a core region for storing data; a data transmitting block for transmitting data between the core region and an input/output pad and generating a data driving signal in order to indicate a timing of outputting the data; a reference data generating block for generating a reference data; and a switching block for outputting the reference data in response to the data driving signal, wherein the data and the reference data are combined and outputted through the input/output pad.

In accordance with another aspect of the present invention, there is provided a method for transmitting a data between an inside and an outside of the semiconductor memory device, including the steps of a) generating a reference data; b) sensing a timing of outputting a data from the inside of the semiconductor memory device to thereby generate a data driving signal; c) transmitting the reference data in response to the data driving signal; and d) transmitting an output signal including the data and the reference data.

BRIEF DESCRIPTION OF DRAWINGS

The above and other objects and features of the present invention will become apparent from the following description of preferred embodiments taken in conjunction with the accompanying drawings, in which:

FIG. 4 is a table depicting an operation of the data output driving block shown in FIG. 3;

FIG. 7 is a table depicting an operation of the data output driving block shown in FIG. 6;

DETAILED DESCRIPTION OF THE INVENTION

Hereinafter, a semiconductor device having a data output driving block for receiving a first supply voltage in order to generate an internal voltage according to the present invention will be described in detail referring to the accompanying drawings.

Figure 1:
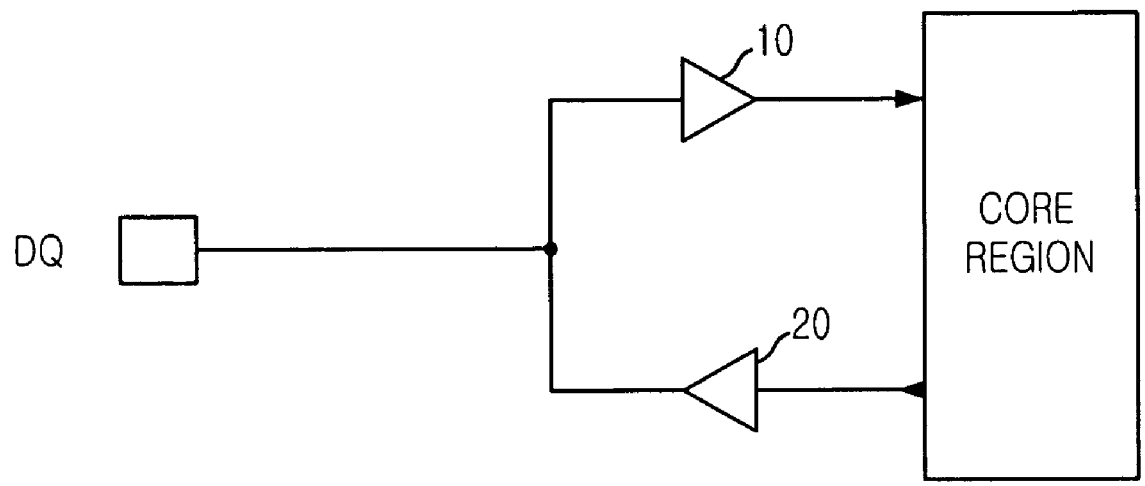
FIG. 1 is a block diagram showing a data input/output driver in a conventional semiconductor memory device.
Figure 2A:
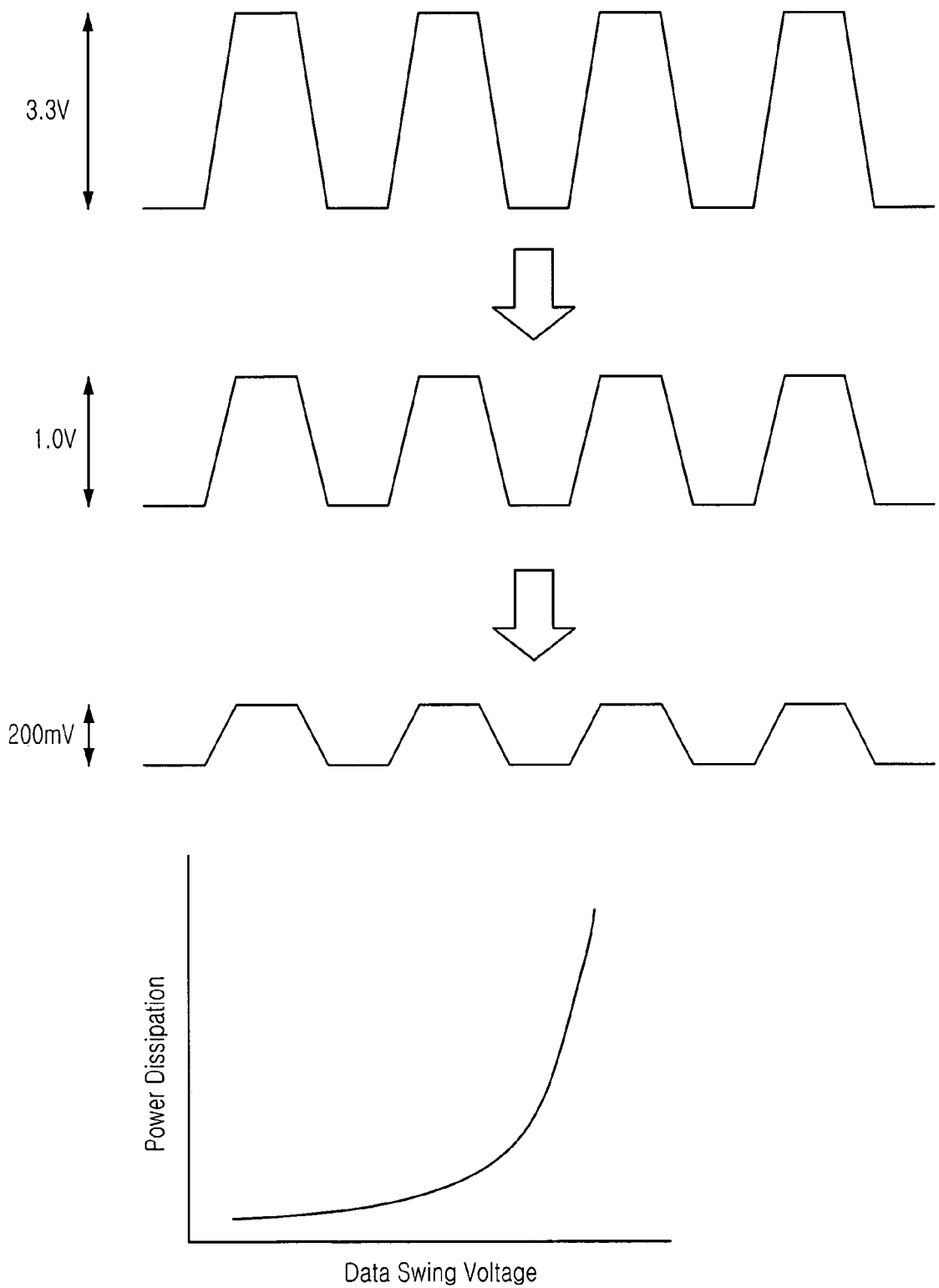
FIG. 2A is a waveform describing an operation of the input/output driver shown in FIG. 1.
Figure 2B:
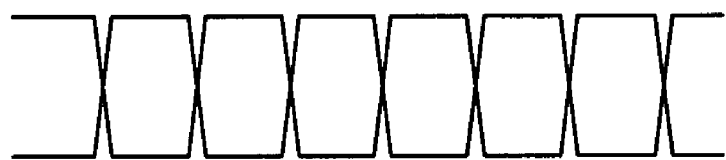
FIG. 2B is a waveform describing a fault under the operation of the input/output driver shown in FIG. 1.
Figure 2B:
Figure 2B:
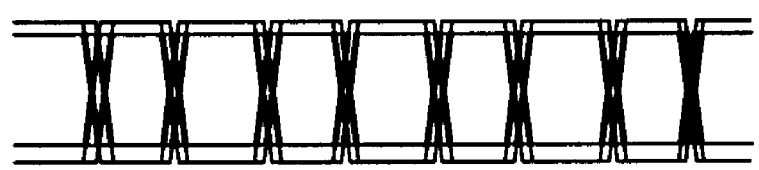
Figure 3:
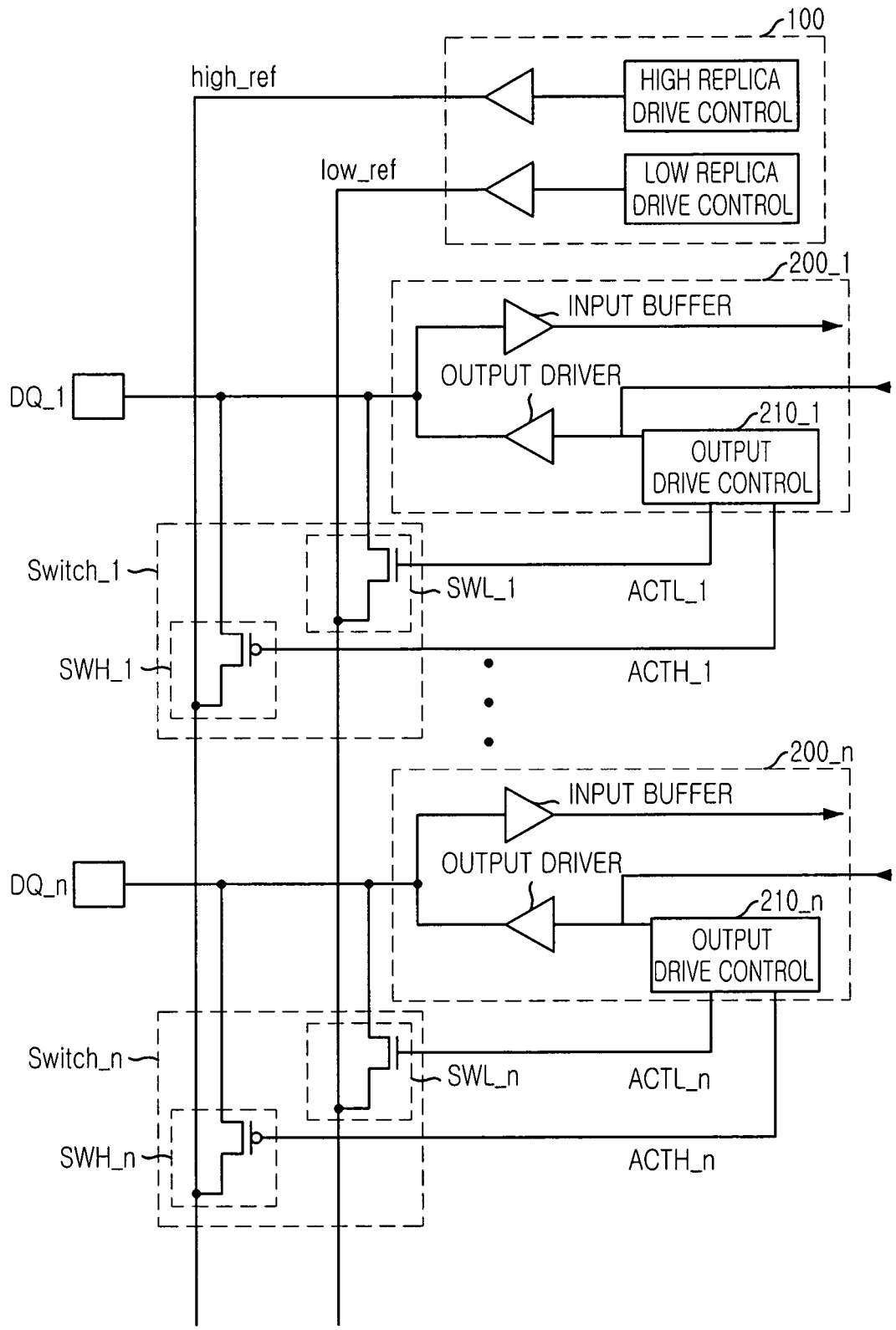
FIG. 3 is a block diagram showing a data output driving block included in a semiconductor memory device in accordance with an embodiment of the present invention.

FIG. 3 is a block diagram showing a data output driving block included in a semiconductor memory device in accordance with an embodiment of the present invention.

As shown, the semiconductor memory device includes a plurality of the data output driving blocks. If the semiconductor memory device has n number of data pads DQ_1 to DQ_n, n number of the data output driving blocks are included in the semiconductor memory device. Herein, n is a positive integer. Further, the data output driving block corresponding to a first data pad DQ_1 includes a data transmitting block, e.g., 200_1, a reference data generating block, e.g., 100 and a switching block, e.g., Switch_1. The numbers of data transmitting blocks and the switching blocks are respectively matched with the number of the data pads. However, it is enough that at least one reference data generating block 100 is included in the semiconductor memory device.

The data transmitting block 200_1 is for transmitting a data between an inside and an outside of the semiconductor memory device and generating a data driving signal ACTL_1 and ACTH_1 in order to indicate a timing of outputting the data. The reference data generating block 100 generates a reference data high_ref and low_ref. Lastly, the switching block Switch_1 outputs the reference data high_ref and low_ref to the first data pad DQ1 in response to the data driving signal ACTL_1 and ACTH_1. Then, the semiconductor memory device outputs a combined signal of the data outputted from the data transmitting block 200_1 and the reference data outputted from the switching block Switch_1 into the first data pad DQ1 as an output signal.

Herein, the reference data includes a first reference signal high_ref and a second reference signal low_ref respectively having a stable period and a stable voltage level. That is, the first and second reference signals high_ref and low_ref don't undergo any noise, any skew or any jitter. As a result, each timing of outputting the first and second reference signals high_ref and low_ref, i.e., each stable period of first and second reference signals high_ref and low_ref, is corresponding to a desired cycle of a required specification about the semiconductor memory device. Also, since the first and second reference signals high_ref and low_ref don't undergo any noise, any skew or any jitter, each of the first and second reference signals high_ref and low_ref can have stable voltage level corresponding to a first logic level data and a second logic level data, i.e., a logic high level data and a logic low level data.

In detail, the data transmitting block, e.g., 200_1, includes an output driver and an output driver control block, e.g., 210_1. The output driver is for receiving a data inputted from the inside of the semiconductor memory device, i.e., a core region, and delivering the data into the outside of the semiconductor memory device. The output drive control block, e.g., 210_1, senses the timing of outputting the data to thereby output the data driving signal, e.g., ACTL_1 and ACTH_1, to the switching block, e.g., Switch_1.

Further, the data transmitting block 200_1 includes an input buffer for receiving a data inputted from the outside of the semiconductor memory device through the first data pad DQ_1 and delivering the data into the inside of the semiconductor memory device, i.e., the core region.

Moreover, the data driving signal outputted from the output drive control block 210 is constituted with a first timing control signal ACTH_1 and a second timing control signal ACTL_1. The first timing control signal ACTH_1 is corresponding to a timing of outputting a first logic level data and the second timing control signal ACTL_1 is corresponding to a timing of outputting a second logic level data.

The reference data generating block 100 includes a high replica drive control block for generating the first reference signal high_ref to the switching block, e.g., Switch_1 and Switch_n; and a low replica drive control block for generating the second reference signal low_ref to the switching block, e.g., Switch_1 and Switch_n.

In addition, the semiconductor memory device includes a plurality of the switching blocks Switch_1 to Switch_n, each switching block constituted with two switches. Herein, a first switching block Switch_1 includes a first switch SWH_1 and a second switch SWL_1. The first switch SWH_1 is for transmitting the first reference signal high_ref in response to the first timing control signal ACTH_1; and the second switch is for transmitting the second reference signal low_ref in response to the second timing control signal ACTL_1.

In detail, the first and the second switches SWH_1 and SWL_1 are MOS transistors; and, more particularly, the first switch SWH_1 is a PMOS transistor and the second switch SWL_1 is a NMOS transistor.

FIG. 4 is a table depicting an operation of the data output driving blocks shown in FIG. 3. Hereinafter, referring to FIGS. 3 and 4, the operations of the data output driving blocks are described in detail. Also, since each operation of the data output driving blocks is very similar though the semiconductor memory device has plural data output driving blocks corresponding to the data pads DQ_1 to DQ_n, the operation of the data output driving block corresponding to the first data pads DQ_1 is described herein and others are omitted.

First, in the reference data generating block 100, the high replica drive control block generates the first reference signal high_ref having a stable period and a stable voltage level corresponding to a logic high level data and the low replica drive control block generates the second reference signal low_ref having a stable period and a stable voltage level corresponding to a logic low level data.

As above described, since the first and the second reference signals high_ref and low_ref don't undergo any noise, any skew or any jitter, each timing of outputting the first and second reference signals high_ref and low_ref satisfies each desired cycle of the required specification about the semiconductor memory device.

Meanwhile, when the semiconductor memory device outputs a data stored in the core region, the output driver included in the data transmitting block 200_1 buffers the data outputted from the core region to thereby transmit the data to the first data pad DQ1.

At this time, the output drive control block 210_1 senses the data transmitted through the output driver and, then, generates one of the first timing control signal ACTH_1 and the second timing control signal ACTL_1 based on whether the data is a logic high or a logic low. That is, if the data is a logic high, the first timing control signal ACTH_1 is activated as a logic low level and the second timing control signal ACTL_1 is inactivated as a logic low level; and, if the data is a logic low, the second timing control signal ACTL_1 is activated as a logic high level and the first timing control signal ACTH_1 is inactivated as a logic high level.

Referring to FIG. 4, when an output data transmitted through the first data pad DQ_1 is a logic high, the first timing control signal ACTH_1 is activated as a logic low level and the second timing control signal ACTL_1 is inactivated as a logic low level. On the contrary, referring to a second data pad DQ_2, i.e., if an output data is a logic low, the second timing control signal ACTL_2 is activated as a logic high level and the first timing control signal ACTH_2 is inactivated as a logic high level.

Then, the first timing control signal ACTH_1 and the second timing control signal ACTL_1 are inputted to the first switching block Switch_1. Namely, the first timing control signal ACTH_1 is inputted to the first switch SWH_1 and the second timing control signal ACTL_1 is inputted to the second switch SWL_1.

As a result, in response to the first timing control signal ACTH_1 and the second timing control signal ACTL_1, it is determined whether the first and the second switches SWH_1 and SWL_1 are turned on or off. In the case of the first data pad DQ_1, the first switch SWH_1 is turned on and the second switch SWL_1 is turned off in response to the first timing control signal ACTH_1 and the second timing control signal ACTL_1 being a logic low. Likewise, in the case of the second data pad DQ_2, the first switch SWH_2 is turned off and the second switch SWL_2 is turned on in response to the first timing control signal ACTH_2 and the second timing control signal ACTL_2 being a logic high.

Finally, although a data outputted from the core region through the output driver included in the data transmitting block 200_1 is distorted, i.e., is outputted as a strained signal because of the noise, skew and jitter, the data can be compensated by the first or the second reference signal high_ref or low_ref.

In addition, even though a data outputted from the core region through the output driver is not distorted, the data is not distorted by the first or the second reference signal high_ref or low_ref.

As above described, each data transmitted through the output driver of each data transmitting block 200_1 to 200_n determines whether the first and the second switches SWH_1 to SWH_n and SWL_1 to SWL_n included in each switching block Switch_1 to Switch_n is turned on or not. And then, one of the first and the second reference signals high_ref and low_ref is delivered into each data pad DQ_1 to DQ_n.

Figure 5:
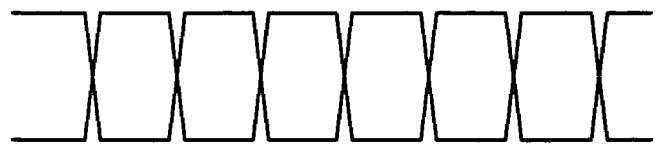
FIG. 5 is a waveform describing the operation of the data output driving block shown in FIG. 3.
Figure 5:
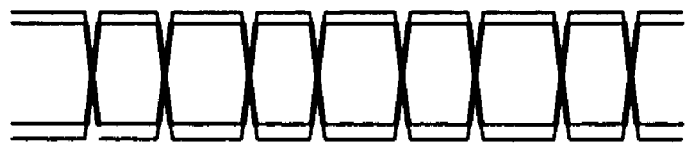
Figure 5:
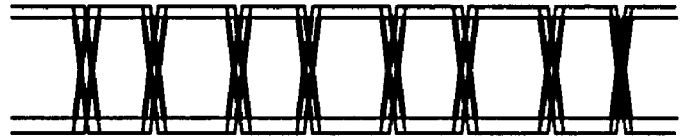
Figure 5:

FIG. 5 is a waveform describing the operation of the data output driving block shown in FIG. 3.

As shown, there are described four kinds of output signals. A first one, i.e., the symbol 'A', shows a normal signal; and a second one and a third one, i.e., the symbols 'B' and 'C' show unstable signals. As compared with the symbol 'A', a voltage level of the signal described in the symbol 'B' is distorted. Namely, it is shown that a strained signal is outputted from the semiconductor memory device when a noise is generated. The symbol 'C' describes a strained signal distorted by a skew or a jitter on the data path of the semiconductor memory device.

On the other hand, in the last waveform, i.e., the symbol 'D', the output signal of the semiconductor memory device according to the present invention is described. Referring to the symbol 'D', it is understood that the output signal compensated by the first or the second reference signal high_ref or low_ref is minimally distorted.

Figure 6:
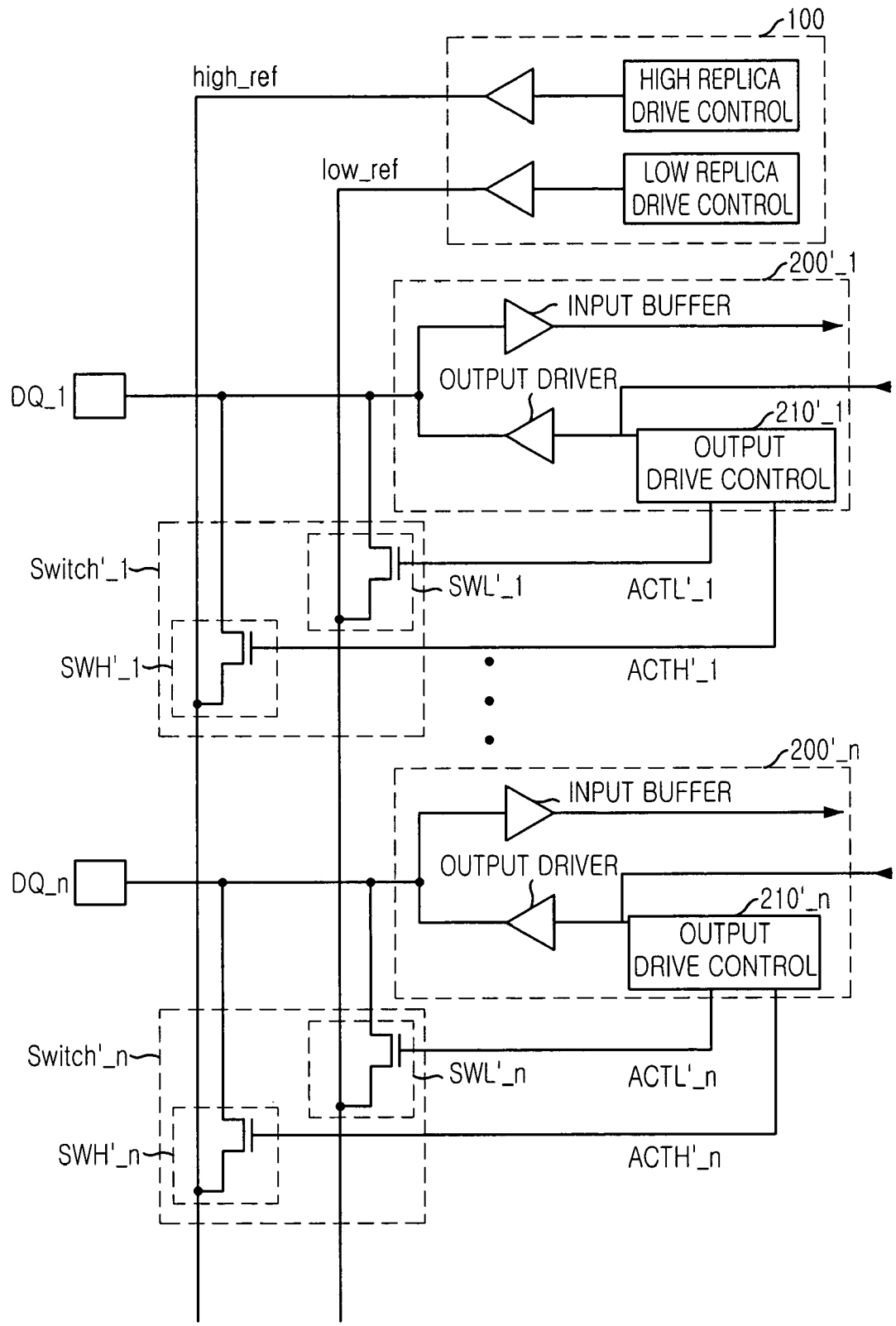
FIG. 6 is a block diagram showing a data output driving block included in a semiconductor memory device in accordance with another embodiment of the present invention.

FIG. 6 is a block diagram showing a data output driving block included in a semiconductor memory device in accordance with another embodiment of the present invention;

As shown, the semiconductor memory device includes a plurality of the data output driving blocks. If the semiconductor memory device has n number of data pads DQ_1 to DQ_n, n number of the data output driving blocks are included in the semiconductor memory device. Herein, n is a positive integer. Further, the data output driving block corresponding to a first data pad DQ_1 includes a data transmitting block, e.g., 200'_1, a reference data generating block, e.g., 100, and a switching block, e.g., Switch'_1. The number of data transmitting blocks and the switching blocks are respectively matched with the number of the data pads. However, it is enough that at least the reference data generating block 100 is included in the semiconductor memory device.

As compared with FIG. 3, the semiconductor memory device shown in FIG. 6 is a similar to the semiconductor memory device shown in FIG. 3 in their structures. Thus, a difference between those of the semiconductor memory devices respectively shown in FIGS. 3 and 6 is described herein.

Referring to FIG. 6, each switching block Switch'_1 to Switch'_n is constituted with two switches. Herein, first and second switches SWH'_1 and SWL'_1 included in the first switching block Switch'_1 are NMOS transistors.

As a result, if a first timing control signal ACTH'_1 is a logic high, the first switch SWH'_1 is turned on. That is, the first switch SWH'_1 is activated when the first timing control signal ACTH'_1 is a logic high. Thus, if the output driver included in a data transmitting block 200'_1 transmits a logic high level data, a output drive control block 210'_1 included in the data transmitting block 200'_1 generates the first timing control signal ACTH'_1 being a logic high.

FIG. 7 is a table depicting an operation of the data output driving block shown in FIG. 6. As compared with FIG. 4, there is a difference about each logic level of the first timing control signal ACTH'_1 in order to turn on the first switch SWH'_1. However, for turning on the second switch SWL'_1, a second timing control signal ACTL'_1 is the same as the second timing control signal ACTL_1 shown in FIG. 3.

Figure 8:
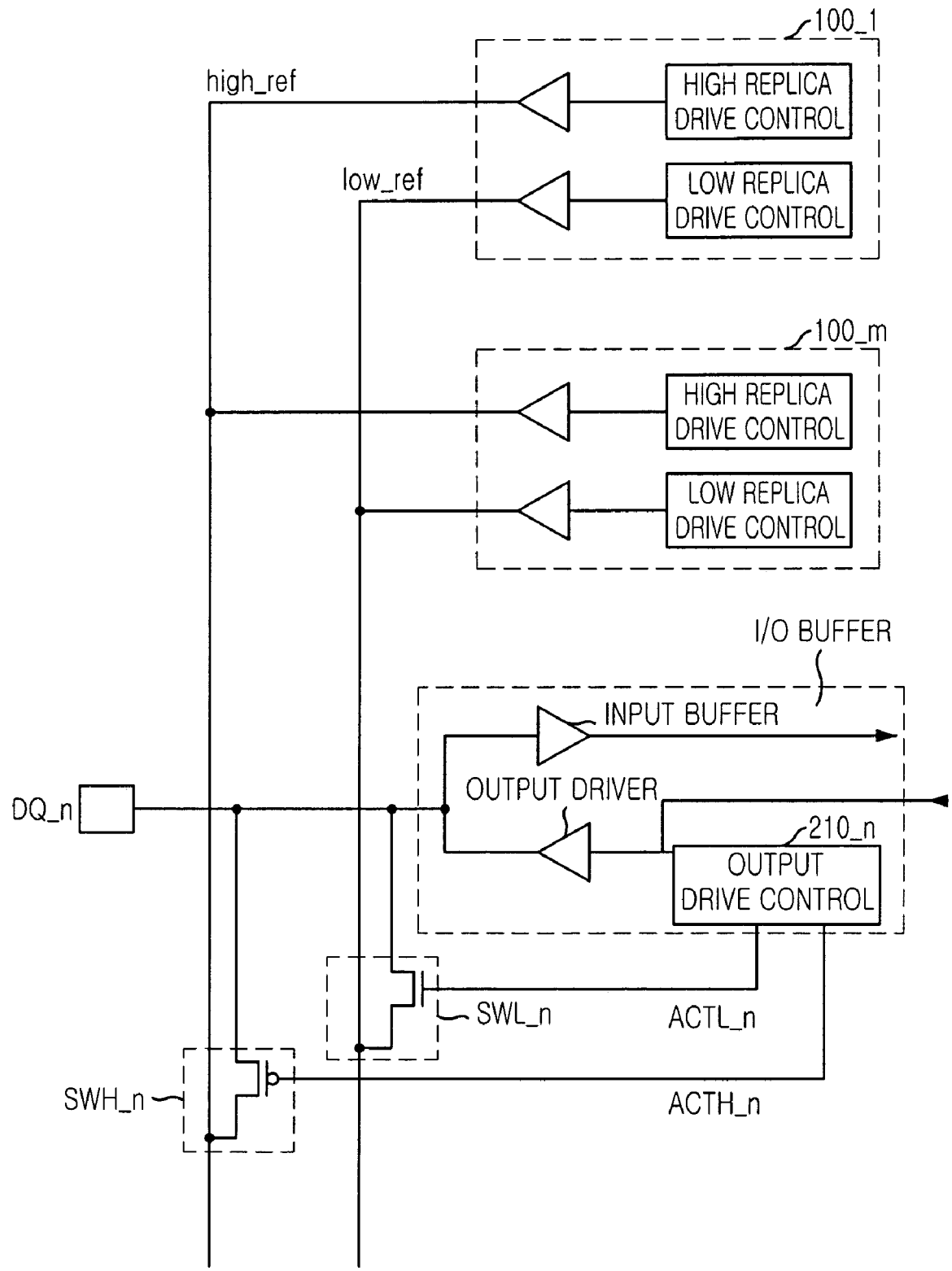
FIG. 8 is a block diagram showing a data output driving block included in a semiconductor memory device in accordance with another embodiment of the present invention.

FIG. 8 is a block diagram showing a data output driving block included in a semiconductor memory device in accordance with another embodiment of the present invention.

As shown, the semiconductor memory device is similar to the semiconductor memory device shown in FIG. 3. However, the semiconductor memory device shown in FIG. 8 further includes a sub reference data generating block, e.g., 100_m, for generating a sub-reference data, wherein the sub-reference data and the reference data, i.e., the first reference signal high ref and the second reference signal low_ref, respectively have the same period and the same voltage level.

Herein, the semiconductor memory device has a plurality of the sub reference data generating blocks 100_1 to 100_m for compensating a data outputted through each data pad DQ_1 to DQ_n more effectively. Namely, even though a lot of data transmitted through each data transmitting block are distorted, the data can be compensated more effectively by using the reference data generating block 100_1 and the plurality of the sub reference data generating blocks 100_1 to 100_m.

Further, like each reference data high_ref and low_ref, the sub-reference data is constituted with two data signal respectively having a first logic level and a second logic level.

Figure 9:
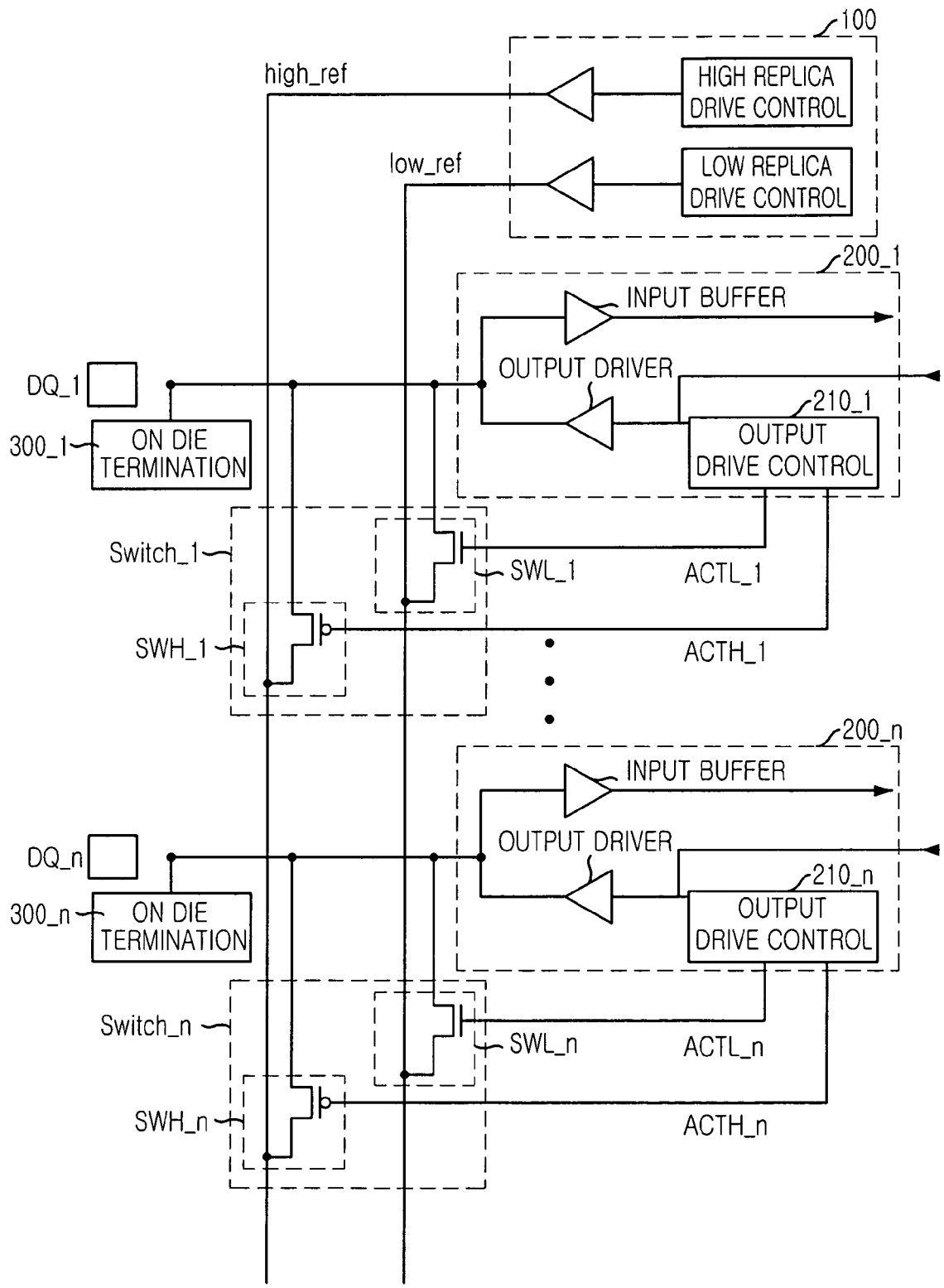
FIG. 9 is a block diagram showing a data output driving block included in a semiconductor memory device in accordance with another embodiment of the present invention.

FIG. 9 is a block diagram showing a data output driving block included in a semiconductor memory device in accordance with another embodiment of the present invention.

As shown, the semiconductor memory device is similar to the semiconductor memory device shown in FIG. 3. However, the semiconductor memory device shown in FIG. 9 further includes a plurality of on-die termination blocks 300_1 to 300_n.

Each on-die termination blocks 300_1 to 300_n is coupled between each data transmitting block and each data pad, for eliminating an interference between consecutively outputted data transmitted through each data pad.

As compared with FIG. 3, the semiconductor memory device shown in FIG. 6 is a similar to the semiconductor memory device shown in FIG. 3 in their structures. Therefore, a detailed description of the semiconductor memory device is omitted herein.

In a semiconductor memory device having a data output driving block according to the present invention, though a data signal transmitted through an output driver or a data pad is distorted by a noise, a jitter and a skew, the data signal can be compensated by using the first or the second reference signals. Therefore, in a semiconductor memory device operating at a high speed, a reliability of an operation for transmitting data can be increased.

In addition, if a semiconductor memory device in accordance with the present invention is applied to a system, the system employing the semiconductor memory device can be stably operated.

The present application contains subject matter related to Korean patent application No. 2004-87703, filed in the Korean Patent Office on Oct. 30, 2004, the entire contents of which being incorporated herein by reference.

While the present invention has been described with respect to the particular embodiments, it will be apparent to those skilled in the art that various changes and modification may be made without departing from the spirit and scope of the invention as defined in the following claims.

What is claimed is:

1. A data input/output driver for use in a semiconductor memory device, comprising:
   a data transmitting block for transmitting data between an inside and an outside of the semiconductor memory device, and generating, when sensing the data transmitted through the data transmitting block, a first timing control signal when the data has a logic high level and a second timing control signal when the data has a logic low level;
   a reference data generating block for generating a reference data including a first reference signal having a first stable period and a first stable voltage level corresponding to a logic high level data, and a second reference signal having a second stable period and a second stable voltage level corresponding to a logic low level data; and
   a switching block for selectively transferring the first and second reference signals into a node as an output signal wherein the switching block transfers the first reference signal into the node in response to the first timing control signal, and transfers the second reference signal into the node in response to the second timing control signal, wherein the first reference signal provides the first stable voltage level to the node as the output signal during an entire period when the output signal has the logic high level, and the second reference signal provides the second stable voltage level to node as the output signal during an entire period when the output signal has the logic low level.

2. The data input/output driver as recited in claim 1, wherein the data transmitting block includes:
   a data output driver for receiving data from inside the semiconductor memory device and delivering the data outside the semiconductor memory device; and
   an output driving control block for sensing the timing of outputting the data and outputting the first timing control signal and the second timing control signal as a data driving signal to the switching block.

3. The data input/output driver as recited in claim 2, wherein the output driving control block generates the first timing control signal corresponding to a timing of outputting a first logic level data and the second timing control signal corresponding to a timing of outputting a second logic level data.

4. The data input/output driver as recited in claim 3, wherein the reference data generating block includes:
   a first reference data generator for generating the first reference signal to the switching block; and
   a second reference data generator for generating the second reference signal to the switching block.

5. The data input/output driver as recited in claim 4, wherein the switching block includes:
   a first switch for transmitting the first reference signal in response to the first timing control signal; and a second switch for transmitting the second reference signal in response to the second timing control signal.

6. The data input/output driver as recited in claim 5, wherein each of the first and second switches is a MOS transistor.

7. The data input/output driver as recited in claim 5, wherein the first switch is a PMOS transistor and the second switch is an NMOS transistor.

8. The data input/output driver as recited in claim 5, wherein each of the first and second switches is an NMOS transistor.

9. The data input/output driver as recited in claim 2, wherein the data transmitting block further includes a data input driver for receiving the data from outside the semiconductor memory device and delivering the data inside the semiconductor memory device.

10. The data input/output driver as recited in claim 1, further comprising an on-die termination block coupled to the data transmitting block for eliminating an interference between consecutively outputted data.

11. The data input/output driver as recited in claim 1, further comprising a sub reference data generating block for generating a sub-reference data, wherein the sub-reference data has the same period and the same voltage level as that of the reference data.

12. The data input/output driver as recited in claim 11, wherein the sub-reference data outputted from the sub reference data generating block is combined into the data and the reference data as the output signal.

13. The data input/output driver as recited in claim 12, wherein each of the reference data and the sub-reference data is constituted with two data signals respectively having a first logic level and a second logic level.

14. A semiconductor memory device, comprising:
   a core region for storing data;
   a data transmitting block for transmitting data between the core region and an input/output pad and generating, when sensing the data transmitted through the data transmitting block, a first timing control signal when the data has a logic high level and a second timing control signal when the data has a logic low level;
   a reference data generating block for generating a reference data including a first reference signal having a first stable period and a first stable voltage level corresponding to a logic high level data, and a second reference signal having a second stable period and a second stable voltage level corresponding to a logic low level data; and
   a switching block for selectively transferring the first and second reference signals into a node as an output signal, wherein the switching block transfers the first reference signal into the node in response to the first timing control signal, and transfers the second reference signal into the node in response to the second timing control signal,
   wherein the first reference signal provides the first stable voltage level to the node as the output signal during an entire period when the output signal has the logic high level, and the second reference signal provides the second stable voltage level to node as the output signal during an entire period when the output signal has the logic low level.

15. The semiconductor memory device as recited in claim 14, wherein the data transmitting block includes:
   a data output driver for receiving data outputted from the core region and outputting the data to the input/output pad; and
   an output driving control block for sensing the timing of outputting the data and outputting the first timing control signal and the second timing control signal as a data driving signal to the switching block.

16. The semiconductor memory device as recited in claim 15, wherein the output driving control block generates the first timing control signal corresponding to a timing of outputting a first logic level data and the second timing control signal corresponding to a timing of outputting a second logic level data.

17. The semiconductor memory device as recited in claim 16, wherein the reference data generating block includes:
   a first reference data generator for generating the first reference signal to the switching block; and
   a second reference data generator for generating the second reference signal to the switching block.

18. The semiconductor memory device as recited in claim 17, wherein the switching block includes:
   a first switch for transmitting the first reference signal in response to the first timing control signal; and
   a second switch for transmitting the second reference signal in response to the second timing control signal.

19. The semiconductor memory device as recited in claim 18, wherein each of the first and second switches is a MOS transistor.

20. The semiconductor memory device as recited in claim 15, wherein the data transmitting block further includes the data input driver for receiving a data inputted through the input/output pad and delivering the data into the core region.

21. The semiconductor memory device as recited in claim 15, further comprising an on-die termination block coupled to the data transmitting block for eliminating an interference between consecutively outputted data.

22. The semiconductor memory device as recited in claim 14, further comprising a sub reference data generating block for generating a sub-reference data, wherein the sub-reference data has the same period and the same voltage level as that of the reference data.

23. The semiconductor memory device as recited in claim 22, wherein the sub-reference data outputted from the sub reference data generating block is combined into the data and the reference data as the output signal.

24. The semiconductor memory device as recited in claim 23, wherein each of the reference data and the sub-reference data is constituted with two data signals respectively having a first logic level and a second logic level.

25. A method for transmitting a data between an inside and an outside of the semiconductor memory device, comprising the steps of:
   a) generating a reference data including a first reference signal having a first stable period and a first stable voltage level corresponding to a logic high level data, and a second reference signal having a second stable period and a second stable voltage level corresponding to a logic low level data;
   b) sensing a timing of outputting data from inside the semiconductor memory device to thereby generate a first timing control signal when the data has a logic high level and a second timing control signal when the data has a logic low level; and
   c) selectively transmitting the first and second reference signals into a node as an output signal, wherein the first reference signal is transmitted into the node in response to the first timing control signal, and the second reference signal is transmitted into the node in response to the second timing control signal,
   wherein the first reference signal provides the first stable voltage level to the node as the output signal during an entire period when the output signal has the logic high level, and the second reference signal provides the second stable voltage level to node as the output signal during an entire period when the output signal has the logic low level.

26. The method as recited in claim 25, further comprising the step of receiving data from outside the semiconductor memory device to thereby deliver the data inside the semiconductor memory device.

27. A data input/output driver, comprising:
a data transmitting block for transmitting data and generating, when sensing the data transmitted through the data transmitting block, a first timing control signal when the data has a logic high level and a second timing control signal when the data has a logic low level;
a reference data generating block for generating a first reference signal having a first stable period and a first stable voltage level corresponding to a logic high level data, and second reference signal having a second stable period and a second stable voltage level corresponding to a logic low level data; and
a switching block for selectively transferring the first and second reference signals into a node as an output signal, wherein the switching block transfers the first reference signal into the node in response to the first timing control signal, and transfers the second reference signal into the node in response to the second timing control signal,
wherein the first reference signal provides the first stable voltage level to the node as the output signal during an entire period when the output signal has the logic high level, and the second reference signal provides the second stable voltage level to node as the output signal during an entire period when the output signal has the logic low level.

28. The data input/output driver as recited in claim 27, wherein the data transmitting block includes:
a data output driver for receiving the data from inside a semiconductor memory device and delivering the data outside a semiconductor memory device; and
an output driving control block for sensing the timing of outputting the data and outputting the first timing control signal and the second timing control signal as a data driving signal to the switching block.

* * * * *